United States Patent [19]

Walker

[11] 4,130,624
[45] Dec. 19, 1978

[54] PIEZO-ELECTRIC DISC MOUNTING METHODS AND APPARATUS

[75] Inventor: Richard K. Walker, Convent Station, N.J.

[73] Assignee: Ohaus Scale Corporation, Florham Park, N.J.

[21] Appl. No.: 848,134

[22] Filed: Nov. 3, 1977

[51] Int. Cl.² ............................................. H01L 41/10
[52] U.S. Cl. ..................................... 310/328; 310/338; 310/348; 310/354; 29/25.35
[58] Field of Search ............... 310/321, 323, 338, 354, 310/348; 29/25.35; 73/88.5, 517 R, 517 AV, 493

[56] References Cited

U.S. PATENT DOCUMENTS

| | | |
|---|---|---|
| 3,274,828 | 9/1966 | Pulvari .............................. 73/141 A |
| 3,386,292 | 6/1968 | Watson .............................. 73/517 R |
| 3,541,849 | 11/1970 | Corbett ............................ 310/338 X |
| 3,891,870 | 6/1975 | Corbett ............................ 310/338 |
| 4,020,448 | 4/1977 | Corbett ............................ 310/338 X |

Primary Examiner—Mark O. Budd
Attorney, Agent, or Firm—Robert R. Jackson

[57] ABSTRACT

A piezo-electric disc (e.g., a force transducer or a radio reference crystal) is mounted on its edge between two opposing anvils of material which is selected to plastically deform only under a relatively high proof load applied to the disc through the anvils while an extreme pressure lubricant is present between the edge of the disc and the anvils to provide seats of limited area for the edge of the disc.

36 Claims, 14 Drawing Figures

PIEZO-ELECTRIC DISC MOUNTING METHODS AND APPARATUS

BACKGROUND OF THE INVENTION

This invention relates to mounting methods and apparatus for piezo-electric discs such as force transducers and radio reference crystals.

Force transducers in which a piezo-electric disc is mounted on its edge between two opposing anvils are known. U.S. Pat. No. 3,274,828 issued to Pulvari, U.S. Pat. No. 3,386,292 issued to R. A. Watson et al., and U.S. Pat. Nos. 3,891,870 and 4,020,448 issued to J. P. Corbett all show such transducers.

In Corbett U.S. Pat. No. 3,891,870, for example, a plate-like piezo-electric crystal disc is mounted on its edge between a brass-clad stainless steel lower platform and a brass-clad stainless steel upper force platform. As described by Corbett, the edge of the crystal wears a permanent indent in the brass shims on the stainless steel platforms, thereby seating the crystal. The platforms are biased together so that the crystal remains in the seats. A load or force applied to the crystal through the force platform causes a proportional change in the resonant frequency of the crystal. Accordingly, the load or force applied to the crystal can be measured by determining the new resonant frequency or the change in resonant frequency of the crystal. Corbett shows and describes circuits for monitoring the resonant frequency of the crystal. Other circuits for performing this function are shown and described in the other patents mentioned above.

The piezo-electric discs in transducers of the kind described above may be either crystals such as quartz, or ceramics such as barium titanate, lithium tantalate, or lithium niobate. The frequency response of the disc is generally extremely sensitive to the angular orientation of the disc relative to the axis of applied force. For precise, repeatable, linear frequency response it is desirable to apply the force to the smallest possible areas on the edge of the disc. In addition, to provide a transducer with greater sensitivity and/or greater usable load span, it is desirable to provide a disc mounting which will permit increased maximum loading of the disc in the limited areas of contact between the mounting and the edge of the disc. On the other hand, these piezoelectric materials are extremely brittle. Although they have relatively high compressive strength, their tensile strength is relatively low, and they are easily chipped, cracked, or fractured during mounting and subsequent loading.

A radio reference crystal disc, which is also piezo-electric, may be mounted similarly to the piezo-electric discs in force transducers of the type described above. A mounting of this type is particularly preferred as a shock mounting for enabling the crystal to withstand forces due to high accelerations and the like. The crystal is typically mounted along its axis of zero force-frequency coefficient, and the crystal is heavily loaded to maintain it in its mounting despite acceleration forces or the like. Many of the considerations which apply to mounting piezo-electric discs in force transducers also apply to such mountings of radio reference crystals.

In view of the foregoing, it is an object of this invention to provide improved methods and apparatus for mounting piezo-electric discs in applications of the type described above.

It is a more particular object of this invention to provide methods and apparatus for mounting piezo-electric discs which permit increased loading of the disc while limiting the area of contact between the edge of the disc and the mounting.

It is another more particular object of this invention to provide methods and apparatus for mounting piezo-electric discs which increase the load capacity of the disc and, in the case of force transducers, improve the linearity and repeatability of the transducer.

SUMMARY OF THE INVENTION

In accordance with the methods of the invention, a piezo-electric disc is mounted on its edge between two opposing anvils of material selected to yield or plastically deform only under a relatively high proof load applied to the disc through the anvils. The anvil material is also selected to have a relatively low modulus of work hardening so that the disc does not fail during seating, and also to be elastic after plastic deformation. The disc is positioned on its edge between the two anvils, the areas of contact between the edge of the disc and the anvils are lubricated with an extreme pressure lubricant, and a proof load is applied to the disc through the anvils to cause the edge of the disc to plastically deform or indent the anvils and provide seats of limited area for the edge of the disc. Thereafter, the disc is maintained in the seats by a bias load which may be only a small fraction of the proof load in the case of a force transducer or a major fraction of the proof load in the case of a shock mounted radio reference crystal.

If certain types of extreme pressure lubricants are employed, it may be necessary to set the lubricant prior to applying the proof load. If certain other types of extreme pressure lubricants are employed, it may be necessary to remove them after applying the proof load.

The apparatus of the invention comprises a piezo-electric disc and two opposing anvils for engaging the edge of the disc in seats of limited area formed by applying a relatively high proof load to the disc through the anvils while an extreme pressure lubricant is present between the edge of the disc and the anvils so that the anvils are plastically deformed by the edge of the disc to provide the seats. The anvil material is preselected to plastically deform without work hardening to the extent that the disc fails during seating, and also to be elastic after such plastic deformation.

The segments of the edge of the disc adjacent the anvils may be convexly curved transverse to the plane of the disc to enhance the load capacity of the crystal and further limit the area of contact with the anvils.

The invention increases the proof load which can be applied without causing failure of the disc, while at the same time limiting the area of the seats. The increased proof load increases the subsequent load capacity of a force transducer and permits more shock resistant mounting of a radio reference crystal. The small seats in the elastic anvils keep the disc load at precisely the desired points, and in the case of a force transducer, permit the disc to be subsequently loaded to very near proof load with linear and repeatable transducer frequency response.

Further features of the invention, its nature and various advantages will be more apparent from the accompanying drawing and the following detailed description.

DETAILED DESCRIPTION OF THE INVENTION

The invention will be described in detail herein principally in relation to its application to force transducers. It will be understood, however, that the invention is also useful in other applications such as the mounting of radio reference crystals, all of which applications are within the scope of the invention unless expressly limited herein to a particular application.

Figure 1:
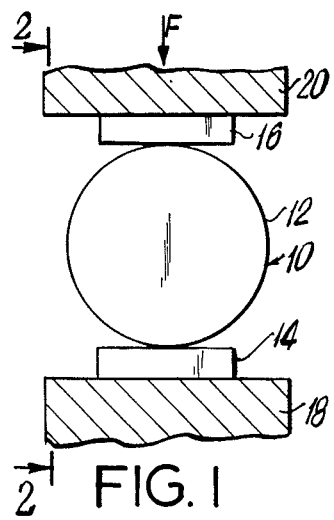
FIG. 1 is a simplified view of a piezo-electric disc mounted in accordance with the principles of this invention.
Figure 2:
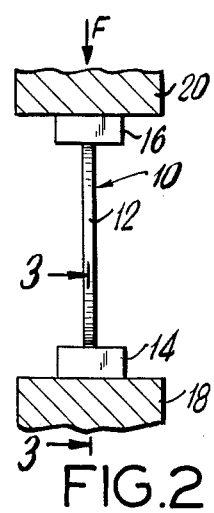
FIG. 2 is a view of the apparatus of FIG. 1 taken along the line 2—2.

As shown in FIGS. 1 and 2, a piezo-electric disc 10 is mounted on its peripheral edge 12 between two opposing anvils 14 and 16. Anvils 14 and 16 are respectively mounted on supports 18 and 20 which are movable relative to one another to allow a load or force F to be applied to disc 10 through anvils 14 and 16.

Although in the particular embodiment shown in FIGS. 1 and 2, disc 10 is a circular plate or wafer, this need not be the case. Other shapes such as those shown in Corbett U.S. Pat. No. 3,891,870 may also be employed, although the periphery will generally be curved to define a disc-like shape. Similarly, although the edge of the disc shown in FIGS. 1 and 2 is cylindrical, the edge of the disc may alternatively be convexly curved transverse to the plane of the disc as shown, for example, in FIGS. 8–12 and discussed in detail below.

Disc 10 may be either a piezo-electric crystal such as quartz, or a piezo-ceramic such as barium titanate, lithium tantalate, or lithium niobate. Typical dimensions for a quartz crystal disc are diameter 0.55 inch and thickness 0.013 inch. Typical dimensions for a piezo-ceramic disc are diameter 0.55 inch and thickness 0.063 inch.

In the particular embodiment shown in FIGS. 1 and 2, the surfaces of anvils 14 and 16 in contact with the edge of disc 10 are initially diametrically opposed parallel planes. Accordingly, the area of contact between the edge of disc 10 and each of anvils 14 and 16 is initially a line or a very narrow rectangle perpendicular to the plane of the disc. The orientation of disc 10 relative to these edge load areas is carefully chosen to provide the desired force-temperature-frequency response characteristics as discussed, for example, in Corbett U.S. Pat. No. 3,891,870. As discussed in greater detail below, anvils 14 and 16 remain diametrically opposed and parallel, but their surfaces are indented by the edge of the disc to provide seats for the disc.

The material of anvils 14 and 16 is selected to resist indentation by the edge of the disc, but to yeild and deform plastically to form seats of limited area for the edge of the disc before the disc fails under the load applied to seat the disc, i.e., the so-called proof load. Ideally, a material is selected which yields just prior to failure of the disc and which has a low modulus of work hardening so that the anvil continues to yield without causing the disc to fail. Typically, the initial yield strength or stress of the anvil material is at least 50% of the initial yield stress of a material of similar elasticity which, if used as the anvil material, would yield as the disc failed. More preferably, this percentage is at least 65%. For convenience herein, the initial yield stress of an anvil material which would yield as the disc failed will be referred to as the "critical yield stress." Accordingly, the initial yield stress of an anvil material selected in accordance with the invention is typically at least 50%, preferably at least 65%, of the critical yield stress.

With regard to the modulus of work hardening of the anvil material, the yield stress of the material after plastic deformation is typically less than 200%, preferably less than 150%, of the initial yield stress of the material at the point of maximum plastic deformation, i.e., the center of the indentation.

The anvil material is also selected to be elastic both before and after plastic deformation. This last characteristic insures that the load response of the disc is repeatable and free from hysteresis effects (i.e., that the same load always produces the same transducer response) as is particularly required in a force transducer.

As is apparent from the foregoing, the anvil material is selected to complement the characteristics of the piezoelectric disc. In general, ferrous anvil materials such as iron and steel are preferred for their elasticity before and after plastic deformation and for their relative freedom from creep and other ageing effects under normal ambient conditions. Within the broad range of ferrous materials, however, materials with appropriate yield strength and modulus of work hardening must be selected as discussed in general terms above in view of the characteristics of the piezo-electric disc.

If the piezo-electric disc is a relatively hard material such as quartz crystal, the anvil material may be a material with a relatively high yield strength but low modulus of work hardening such as ferritic or martensitic steel. Typically, the steel has an initial yield stress in the range from about 30,000 to about 40,000 p.s.i. With regard to the modulus of work hardening, the steel typically has a yield stress after plastic deformation less than 60,000 p.s.i., preferably less than 50,000 p.s.i., at the point of maximum plastic deformation. Examples of suitable steels for use with quartz crystal discs are annealed low carbon steel such as AISI-1010 steel, and annealed low carbon, nickel-free chromium stainless steel such as AISI-403, -410, -416 steel.

If the piezo-electric disc is a less hard material such as a piezo-ceramic, the anvil material is a material with a somewhat lower yield strength and a low modulus of work hardening such as ferritic iron. Typically, the iron has an initial yield stress in the range from about 5,000 to 10,000 p.s.i. After plastic deformation, the iron has a yield stress less than 15,000 p.s.i. at the point of maximum plastic deformation. Examples of suitable iron materials are wrought iron, electrolytic iron, and Armco ingot iron.

In addition to selection of the anvil material as discussed above, an extreme pressure lubricant is used between the edge of the disc and the anvils at least during proof loading in accordance with the principles of the invention. This permits the anvil material to flow relative to the edge of the disc during seating without creating stresses in the disc, particularly localized tensile stresses, which could initiate failure of the disc. Preferably, the extreme pressure lubricant is capable of supporting a load of at least 200,000 p.s.i. normal to the lubricated surfaces without loss of a lubricating layer between the surfaces.

Any of several types of extreme pressure lubricants can be used. Examples of suitable fluid lubricants are chemically adherent halogenated paraffin oils, and greases loaded with molybdenum disulphide or graphite. If a fluid lubricant is used, the lubricant is preferably removed (e.g., by vapor degreasing) after proof loading and seating of the disc to avoid contamination of the disc. Dry film lubricants such as graphite or molybdenum disulphide can also be used, preferably with an adhesive thermosetting binder such as epoxy resin for holding the lubricant in place at least during proof loading. The binder is preferably free of solvents which might contaminate the piezo-electric disc after proof loading. A suitable dry film lubricant is Molydag 254, a dispersion of molybdenum disulphide and other lubricants in a thermosetting resin solution available from Acheson Colloids Company, Port Huron, Michigan 48060.

The extreme pressure lubricant is applied (e.g., by brushing, spraying, etc.) to either or both the edge of the disc and the anvil surfaces prior to proof loading the disc. The lubricant may be applied either before or after the disc has been positioned between the anvils as long as the area of contact is suitably lubricated. Preferably, the lubricant is applied with a thickness in the range from 0.001 to 0.003 inch. If a dry film lubricant with a thermosetting binder is used, the binder is set prior to proof loading the disc.

After the lubricant has been applied and set if necessary, and the disc has been positioned between the anvils as shown, for example, in FIGS. 1 and 2, a compressive proof load (represented by the arrow F in FIGS. 1 and 2) is applied to the disc through the anvils. The proof load may be applied gradually or incrementally. Under the proof load, the edge of the disc causes local yielding and plastic deformation of the anvils. Accordingly, the anvils are permanently indented by the edge of the disc to provide seats for the disc. Typically, the center of the indentation may be of the order of 0.002 to 0.003 inch below the original surface of the disc, the thickness of the anvil material being generally at least several times that dimension. The extreme pressure lubricant between the edge of the disc and the anvils permits the anvil material to flow relative to the edge of the disc without producing stresses which could cause the disc to fail. The choice of anvil material and the presence of the extreme pressure lubricant in accordance with the invention permit increased proof loading of the disc while keeping the area of the resulting disc edge seats relatively small.

Figure 3:
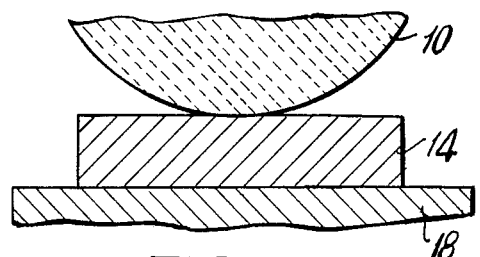
FIG. 3 is an enlarged sectional view of a portion of the apparatus of FIGS. 1 and 2 taken along the line 3—3 in FIG. 2 showing the edge of the disc and an anvil prior to application of the proof load.
Figure 8:
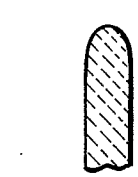
FIGS. 8–12 are enlarged sectional views illustrating various convex piezo-electric disc edges which can be employed in accordance with the invention.
Figures 9, 10:
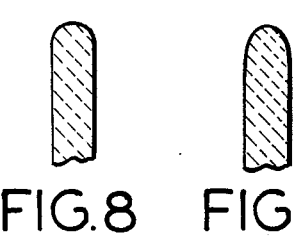
Figure 4:
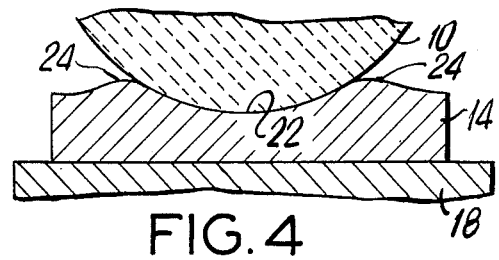
FIG. 4 is similar to FIG. 3, but shows the edge of the disc and anvil during proof loading in accordance with the invention.
Figure 11:

FIGS. 3 and 4 show the effect of proof loading disc 10 on typical anvil 14. Before proof loading, the top surface of anvil 14 is plane as shown in FIG. 3. After proof loading, the anvil surface has been plastically deformed as shown (with the extent of plastic deformation exaggerated for illustrative purposes) in FIG. 4. Anvil material has been pushed or extruded out from under the edge of disc 10 to create an indentation or depression 22 surrounded by a ridge 24. This indentation and ridge form a permanent seat for the edge of the disc. The extreme pressure lubricant layer is not shown in FIGS. 3 and 4, but it is present between the edge of the disc and the anvil during proof loading as described in detail above.

Figure 5:
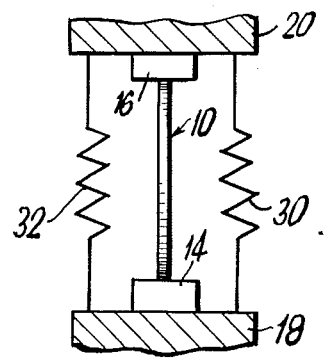
FIG. 5 is similar to FIG. 2 and shows means for applying a bias load to the disc after proof loading.

After the edge of the disc has been seated, the proof load is removed. The disc is then held in place by a smaller compressive bias load applied by any of several means such as tension springs 30, 32 in FIG. 5. In the case of a force transducer this bias load is typically relatively light and may be supplied, for example, by diaphragms as in Corbett U.S. Pat. No. 3,891,870. The transducer can then be used to measure additional applied forces almost as great as the proof load without damage to the transducer. Typically, the maximum safe load (bias and additional applied load) after seating is about 80% of proof load, and may be as high as 90% of proof load.

Accordingly, the load capacity or span of the transducer is increased both by the increased allowable proof load and by the increased safe maximum percentage of proof load which can be subsequently applied.

In the case of a radio reference crystal, the bias load is typically a major fraction of the proof load. Accordingly, a radio reference crystal mounting can be made more rugged because the bias load can be increased.

The configuration of the anvil surface and the shape of the edge of the piezo-electric disc can be modified to further limit the area of the disc seats and increase the load capacity of the disc in accordance with the invention.

Figure 6:
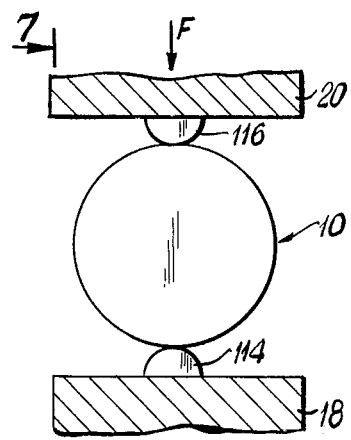
FIGS. 6 and 7 are similar to FIGS. 1 and 2 and show an alternative anvil configuration in accordance with the invention.
Figure 7:
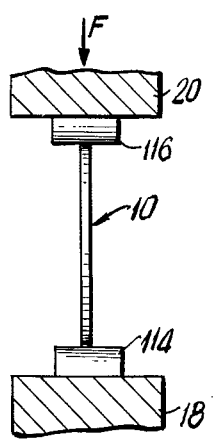

Anvils having surfaces with curvature or tapers in the plane of the disc opposite the curvature of the adjacent portion of the edge of the disc can be used to limit or narrow the area of contact between the disc and the anvils. As shown in FIGS. 6 and 7, for example, anvils 114 and 116 are each half cylinders having substantially smaller radius than disc 10. Accordingly, the area of contact between the disc and the anvils after seating of the disc is more precisely defined than in the case of the initially flat anvils shown in FIGS. 1 and 2. The edge of disc 10 indents the side surface of the half cylindrical anvils somewhat more deeply than under comparable conditions with flat anvils, but the extent of the resulting seat measured peripherally on the edge of the disc is less because the surface of the half cylindrical anvil curves sharply away from the edge of the disc. Other anvil shapes may be used with similar results.

Figure 12:
Figure 13:
FIGS. 13 and 14 are enlarged sectional views illustrating other disc shapes which can be employed in accordance with the invention.
Figure 14:
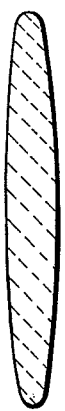

The edge of the disc may be curved convexly transverse to the plane of the disc to strengthen the disc and reduce the size of the disc seats. Any of a wide variety of transverse convex curves may be employed. FIGS. 8–12 illustrate some of the possible edge shapes. These are a half circle (FIG. 8), a segment of an ellipse (FIG. 9), a parabola (FIG. 10), a hyperbola (FIG. 11), and a discontinuous curve with a flat rim section (FIG. 12). Any of these shapes can be used with discs having flat, tapered, or curved side surfaces. For example, FIG. 13 shows a disc with tapered side surfaces and a parabolic curved edge. As another example, FIG. 14 shows a disc in which the edge and side surfaces are all defined by a single elliptical shape.

It will be understood that the foregoing is illustrative of the principles of this invention only, and that various modifications may be made by those skilled in the art without departing from the scope and spirit of the invention. For example, various extreme pressure lubricants may be applied using various techniques, and some lubricants may require setting prior to proof loading or removal after proof loading as discussed above.

What is claimed is:

1. A method of mounting a piezo-electric disc on its edge between two opposing anvils comprising the steps of:

positioning the disc with opposing segments of its edge adjacent the opposing anvils selected of a material having an initial yield stress at least 50% of the critical yield stress and having a yield stress after plastic deformation less than 200% of the initial yield stress at the point of maximum plastic deformation, the selected anvil material being elastic after plastic deformation;

lubricating the areas of contact between the edge of the disc and the anvils with an extreme pressure lubricant; and applying a proof load to the disc through the anvils to cause the anvils to yield and provide seats for the edge of the disc.

2. The method defined in claim 1 wherein the initial yield stress of the anvil material is at least 65% of the critical yield stress.

3. The method defined in claim 1 wherein the yield stress of the anvil material after plastic deformation is less than 150% of the initial yield stress at the point of maximum plastic deformation.

4. The method defined in claim 1 wherein the extreme pressure lubricant is capable of supporting at least 200,000 p.s.i. without loss of a lubricating layer between the lubricated surfaces.

5. The method defined in claim 1 wherein the extreme pressure lubricant is applied with a thickness in the range from 0.001 to 0.003 inch.

6. The method defined in claim 1 further comprising the step of removing the extreme pressure lubricant after applying the proof load.

7. The method defined in claim 1 wherein the extreme pressure lubricant is a dry film lubricant with a thermosetting adhesive binder, and wherein the method further comprises the step of setting the binder of the lubricant prior to applying the proof load.

8. The method defined in claim 1 wherein the piezo-electric disc is a quartz crystal and wherein the selected anvil material is steel having an initial yield stress in the range from 30,000 to 40,000 p.s.i. and a yield stress after plastic deformation of less than 50,000 p.s.i. at the point of maximum plastic deformation.

9. The method defined in claim 8 wherein the anvil material is selected from the group consisting of AISI-1010 steel, AISI-403 steel, AISI-410 steel, and AISI-416 steel.

10. The method defined in claim 1 wherein the piezo-electric disc is a piezo-ceramic material and wherein the selected anvil material is iron having an initial yield stress in the range from 5,000 to 10,000 p.s.i. and a yield stress after plastic deformation less than 15,000 p.s.i. at the point of maximum plastic deformation.

11. The method defined in claim 10 wherein the anvil material is selected from the group consisting of wrought iron, electrolytic iron, and Armco ingot iron.

12. A method of mounting a piezo-electric quartz crystal disc on its edge between opposing metal anvils in a force transducer to increase the load capacity of the transducer while limiting the area of contact between the edge of the disc and the anvils comprising the steps of:

selecting a steel anvil material having an initial yield stress in the range from 30,000 to 40,000 p.s.i. and a yield stress after plastic deformation of less than 60,000 p.s.i. at the point of maximum plastic deformation;

positioning the disc with opposing segments of its edge respectively adjacent the opposing anvils;

applying a layer of extreme pressure lubricant between the edge of the disc and the anvils; and applying a proof load to the disc through the anvils to cause the anvils to yield and form seats for the edge of the disc.

13. The method defined in claim 12 wherein the steel anvil material is selected from the group consisting of ferritic steel and martensitic steel.

14. The method defined in claim 12 wherein the steel anvil material is selected from the group consisting of AISI-1010 steel, AISI-403 steel, AISI-410 steel, and AISI-416 steel.

15. The method defined in claim 12 wherein the extreme pressure lubricant is capable of supporting at least 200,000 p.s.i. without loss of a lubricating layer between the lubricated surfaces.

16. The method defined in claim 12 wherein the layer of extreme pressure lubricant has a thickness in the range from 0.001 to 0.003 inch.

17. The method defined in claim 12 wherein the extreme pressure lubricant is a fluid and wherein the method further comprises removing the lubricant after applying the proof load.

18. The method defined in claim 12 wherein the extreme pressure lubricant is a dry film lubricant with a thermosetting adhesive binder and wherein the method further comprises the step of setting the binder of the lubricant prior to applying the proof load.

19. The method defined in claim 18 wherein the dry film lubricant is selected from the group consisting of molybdenum disulphide and graphite.

20. The method defined in claim 18 wherein the thermosetting adhesive binder is epoxy resin.

21. A mounting for a piezo-electric disc comprising opposing anvils for respectively engaging opposing segments of the edge of the disc in seats formed in the anvils by applying a proof load to the edge of the disc through the anvils while an extreme pressure lubricant is present between the edge of the disc and the anvils so that the anvils are plastically deformed by the edge of the disc to form the seats, the material of the anvils being selected to have an initial yield stress at least 50% of the critical yield stress and a yield stress after plastic deformation less than 200% of the initial yield stress at the point of maximum plastic deformation, and the selected anvil material being elastic after plastic deformation.

22. The mounting defined in claim 21 further comprising means for applying a compressive bias load to the disc through the anvils after application of the proof load to maintain the disc in the seats.

23. The mounting defined in claim 21 wherein the opposing segments of the edge of the disc are convexly curved transverse to the plane of the disc.

24. The mounting defined in claim 21 wherein the anvils are curved in the plane of the disc away from the opposing segments of the edge of the disc.

25. The mounting defined in claim 21 wherein the initial yield stress of the anvil material is at least 65% of the critical yield stress.

26. The mounting defined in claim 21 wherein the yield stress of the anvil material after plastic deformation is less than 150% of the initial yield stress at the point of maximum plastic deformation.

27. The mounting defined in claim 21 wherein the piezo-electric disc is a quartz crystal and the anvil material is steel having an initial yield stress in the range from 30,000 to 40,000 p.s.i. and a yield stress after plastic deformation of less than 50,000 p.s.i. at the point of maximum plastic deformation.

28. The mounting defined in claim 27 wherein the anvil material is selected from the group consisting of AISI-1010 steel, AISI-403 steel, AISI-410 steel, and AISI-416 steel.

29. The mounting defined in claim 21 wherein the piezo-electric disc is a piezo-ceramic material and wherein the anvil material is iron having an initial yield stress in the range from 5,000 to 10,000 p.s.i. and a yield stress after plastic deformation less than 15,000 p.s.i. at the point of maximum plastic deformation.

30. The mounting defined in claim 29 wherein the anvil material is selected from the group consisting of wrought iron, electrolytic iron, and Armco ingot iron.

31. A force transducer comprising:
a piezo-electric quartz crystal disc; and
opposing steel anvils for respectively engaging opposing segments of the edge of the disc in seats formed in the anvils by applying a proof load to the edge of the disc through the anvils while an extreme pressure lubricant is present between the edge of the disc and the anvils so that the anvils are plastically deformed by the edge of the disc to form the seats, the steel anvils having an initial yield stress in the range from 30,000 to 40,000 p.s.i. and a yield stress after plastic deformation of less than 60,000 p.s.i. at the point of maximum plastic deformation.

32. The force transducer defined in claim 31 further comprising means for applying a compressive bias load to the disc through the anvils after application of the proof load to maintain the disc in the seats.

33. The force transducer defined in claim 31 wherein the opposing segments of the edge of the disc are convexly curved transverse to the plane of the disc.

34. The force transducer defined in claim 31 wherein the anvils are curved in the plane of the disc away from the opposing segments of the edge of the disc.

35. The force transducer defined in claim 31 wherein the steel anvil material is selected from the group consisting of ferritic steel and martensitic steel.

36. The force transducer defined in claim 31 wherein the steel anvil material is selected from the group consisting of AISI-1010 steel, AISI-403 steel, AISI-410 steel, and AISI-416 steel.

* * * * *